United States Patent
Lakshminarayan et al.

(10) Patent No.: US 9,349,693 B2
(45) Date of Patent: May 24, 2016

(54) SEMICONDUCTOR DEVICE WITH AN ISOLATION STRUCTURE COUPLED TO A COVER OF THE SEMICONDUCTOR DEVICE

(71) Applicants: Viswanathan Lakshminarayan, Phoenix, AZ (US); Michael E. Watts, Scottsdale, AZ (US); David F. Abdo, Scottsdale, AZ (US)

(72) Inventors: Viswanathan Lakshminarayan, Phoenix, AZ (US); Michael E. Watts, Scottsdale, AZ (US); David F. Abdo, Scottsdale, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/451,962

(22) Filed: Aug. 5, 2014

(65) Prior Publication Data
US 2016/0043039 A1 Feb. 11, 2016

(51) Int. Cl.
*H01L 29/84* (2006.01)
*H01L 23/552* (2006.01)
*H01L 23/053* (2006.01)
*H01L 21/52* (2006.01)

(52) U.S. Cl.
CPC .............. *H01L 23/552* (2013.01); *H01L 21/52* (2013.01); *H01L 23/053* (2013.01)

(58) Field of Classification Search
CPC ...... H01L 23/552; H01L 23/053; H01L 21/52
See application file for complete search history.

(56) References Cited

U.S. PATENT DOCUMENTS

| | | | |
|---|---|---|---|
| 4,370,700 A | 1/1983 | Duddles et al. | |
| 5,663,597 A | 9/1997 | Nelson et al. | |
| 6,261,868 B1 | 7/2001 | Miller et al. | |
| 6,614,102 B1 | 9/2003 | Hoffman et al. | |
| 6,724,079 B2 | 4/2004 | Viswanathan | |
| 7,629,674 B1 | 12/2009 | Foster | |
| 8,030,763 B2 | 10/2011 | Romero et al. | |
| 2009/0096041 A1* | 4/2009 | Sakakibara et al. | 257/419 |
| 2009/0322430 A1 | 12/2009 | Romero et al. | |
| 2011/0001587 A1 | 1/2011 | Sutardja | |

* cited by examiner

*Primary Examiner* — Long Pham
(74) *Attorney, Agent, or Firm* — Sherry W. Schumm

(57) ABSTRACT

A system and method for packaging a semiconductor device that includes a structure to reduce electromagnetic coupling are presented. The semiconductor device is formed on a substrate. A cover is affixed to the substrate so as to extend over the semiconductor device. An isolation structure of electrically conductive material is coupled to the cover in between components of the semiconductor device, with the isolation structure being configured to reduce inductive coupling between those components during an operation of the semiconductor device. In one version, the isolation structure includes a first leg extending from a ground connection along a side wall of the cover to a cross member contiguous with a primary cover wall that extends over the semiconductor device between the components to be isolated electromagnetically.

18 Claims, 5 Drawing Sheets

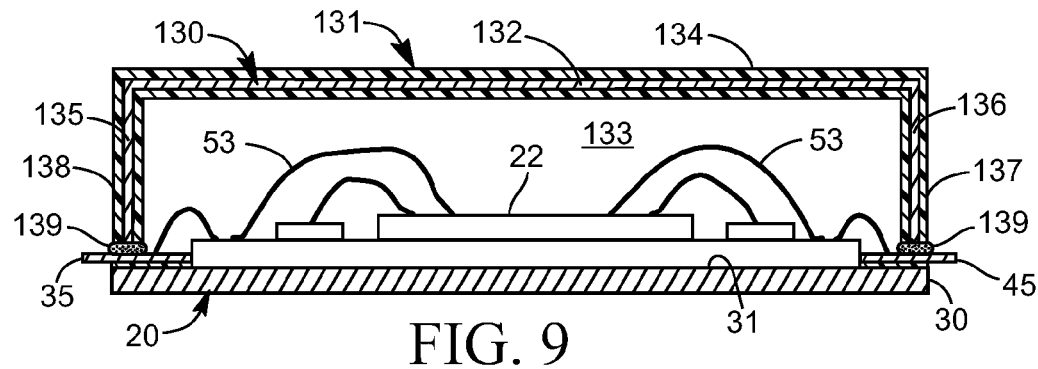
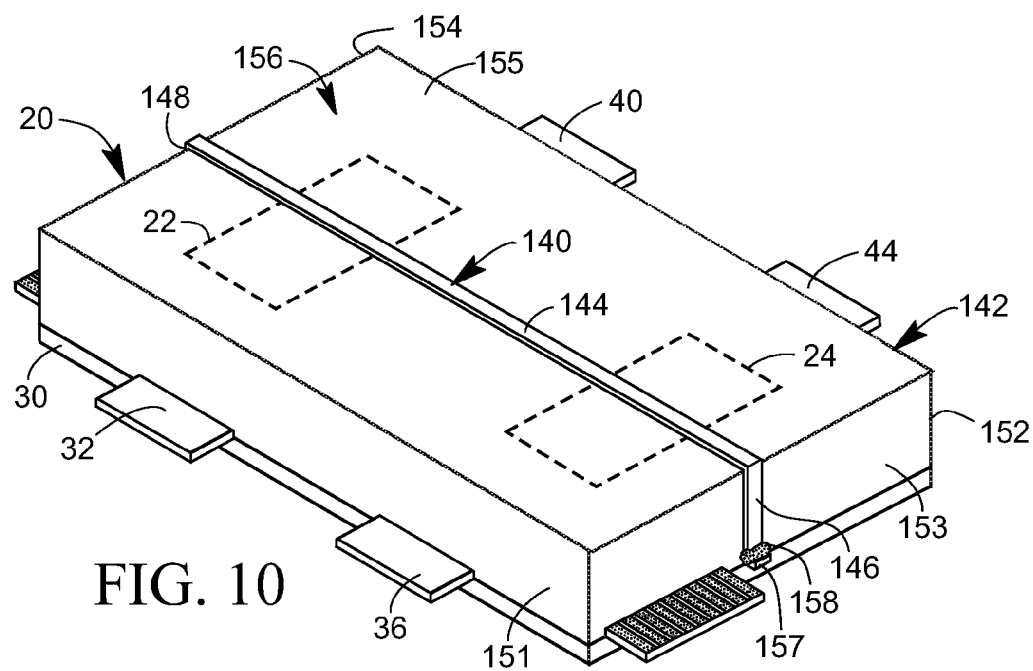

SEMICONDUCTOR DEVICE WITH AN ISOLATION STRUCTURE COUPLED TO A COVER OF THE SEMICONDUCTOR DEVICE

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND

1. Field of Use

The present disclosure relates generally to semiconductor device packages, and more specifically, to such packages and systems incorporating a mechanism to reduce electromagnetic coupling between components in the semiconductor device package.

2. Description of the Related Art

Wireless communication systems often employ power amplifiers for increasing the power of a high frequency signal. In a wireless communication system, a power amplifier is usually the last amplifier in a transmission chain (the output stage). High gain, high linearity, stability, and a high level of power-added efficiency (i.e., the ratio of the difference between the output power and the input power to DC power) are characteristics of an ideal amplifier.

In general, a high frequency power amplifier operates at maximum power efficiency when the power amplifier transmits peak output power. However, power efficiency tends to worsen as output power decreases. Recently, Doherty power amplifier architectures have been the focus of attention not only for base stations, but also for mobile terminals because of the architecture's high power-added efficiency.

A Doherty power amplifier includes two or more amplifiers, such as a carrier amplifier and a peaking amplifier. These amplifiers can be connected in parallel with their outputs joined by an offset transmission line, which performs impedance transformation. The peaking amplifier delivers current as the carrier amplifier saturates, thereby reducing the impedance seen at the output of the carrier amplifier. Thus, the carrier amplifier delivers more current to the load while the carrier amplifier is saturated because of a "load-pulling" effect. Since the carrier amplifier remains close to saturation, a Doherty power amplifier is able to transmit peak output power so that the total efficiency of the system remains relatively high.

Such high frequency power amplifiers commonly are fabricated in a single semiconductor package. However, the circuit architecture presents challenges in terms of the semiconductor package design. Present Doherty power amplifier semiconductor package design calls for the use of discrete devices and integrated circuits that may involve one device which includes the carrier amplifier and a separate device that includes the peaking amplifier. These discrete devices are maintained a distance apart in the package in order to limit problems with high frequency crosstalk that can occur between the carrier and peaking amplifiers.

Unfortunately, maintaining the requisite spatial distance between amplifiers in the package limits the potential for miniaturization of the semiconductor package. Limiting miniaturization is undesirable where low cost, a low weight, and a small volume are important package attributes for various applications.

BRIEF DESCRIPTION OF THE DRAWINGS

The present disclosure is illustrated by way of examples and embodiments and is not limited by the accompanying figures, in which like reference numbers indicate similar elements. For simplicity and clarity of illustration, the drawing figures illustrate the general manner of construction, and details of well-known features and techniques may be omitted to avoid unnecessarily obscuring the invention. Elements in the figures are illustrated for simplicity and clarity and have not been necessarily drawn to scale. In fact, the dimensions of some of the elements or regions in the figures may be exaggerated relative to other elements or regions to better understand embodiments of the apparatus. The figures together with the detailed description are incorporated and form part of the specification and serve to further illustrate examples, embodiments and the like, and explain various principles and advantages, in accordance with the present disclosure, where:

FIG. 9 is a cross section view through the semiconductor package showing an the isolation structure embedded in a cover of that package.

FIG. 10 is a perspective view illustrating an example of an isolation structure employed to reduce coupling between an input and an output of the semiconductor package.

DETAILED DESCRIPTION

Figure 1:
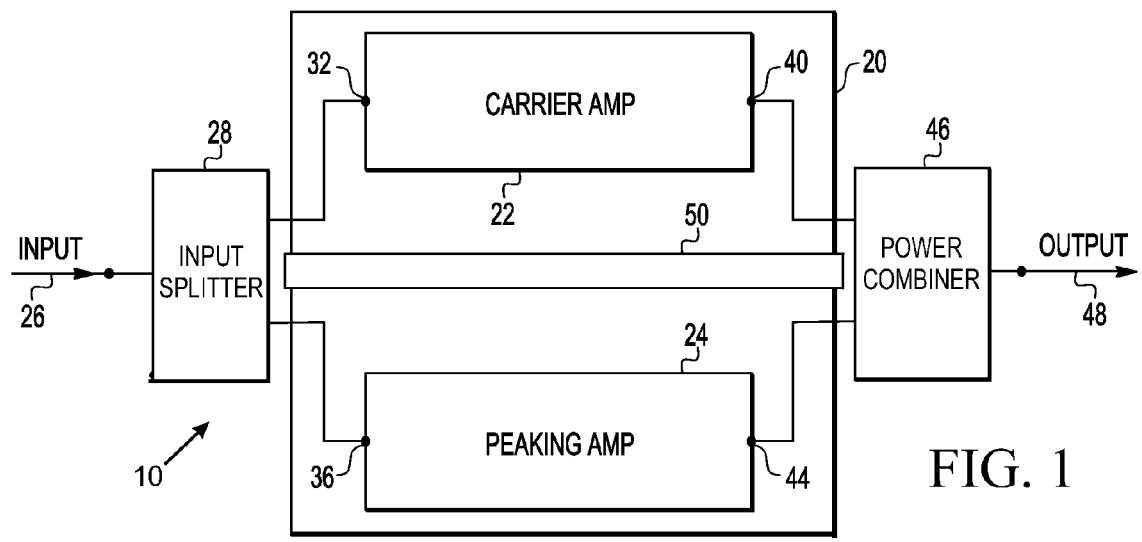
FIG. 1 is a block diagram of an exemplary embodiment of a Doherty power amplifier in a semiconductor package with an isolation structure.

The following detailed description is exemplary in nature and is not intended to limit the invention or the application and uses of the same. Furthermore, there is no intention to be bound by any expressed or implied theory presented in the preceding technical field, background, or the following detailed description.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Reference herein to directional relationships, such as top and bottom or left and right, refer to the relationship of the components in the orientation illustrated in the drawings, which may not be the orientation of the components in all uses of the apparatus being described. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "electrically connected directly" or a "direct electrical connection" mean that the associated components are connected together either by abutting each other or by an electrical conductive element that does not restrict or control the flow of electric current beyond the inherent restriction of any material used as an electrical conductor. The term "coupled," as used herein, is defined as directly or indirectly connected in an electrical or non-electrical manner. "Contiguous with" means on, directly coupled to, within, embedded within, or proximate to. The terms "substantial" and "substantially" herein mean sufficient to accomplish the stated purpose in a practical manner and that minor imperfections, if any, are not significant for the stated purpose. The terms "adhere" and "adhered", as used herein mean that two components that were fabricated separately, are then attached to each other. For example, a substance, such as an epoxy, may be used to attach those components together. Alternatively, one of the components may be fabricated on another component, where the method of fabrication results in the components being adhered together. For example, a cover formed from an encapsulant material may be "adhered" to a substrate by placing the substrate in a mold, flowing uncured encapsulant material over the substrate within the mold, and curing the encapsulant material to adhere the cover (formed from the encapsulant material) to the substrate. In this case, the cover formed from the encapsulant material may be considered to be fabricated separately from and adhered to the substrate.

The present embodiments may be used to improve the usability of a power amplifier semiconductor package in base station power amplifiers, cell phones, other portable devices, and other apparatus dependent upon semiconductor packages, where low cost, low weight, and small volume are desired. The embodiments described herein may reduce inductive coupling between components and wire bond arrays in a multi-path power amplifier (including but not limited to Doherty power amplifiers). However, it will become apparent that the techniques described below for reducing inductive coupling and electromagnetic interference may be implemented in a variety of semiconductor device designs and other circuits.

FIG. 1 shows a block diagram of a Doherty power amplifier 10 that includes a carrier amplifier 22 and a peaking amplifier 24 connected in parallel. The carrier amplifier 22 and peaking amplifier 24 are contained in a semiconductor package 20. A high frequency input signal 26 is divided into two signals by an input splitter 28, which may apply a phase delay to one or both of the signals (e.g., resulting in a 90 degree phase difference between the two signals). The input splitter 28 may be coupled to a printed circuit board (not illustrated) or other substrate to which the semiconductor package 20 is coupled, or the input splitter 28 may be included within the semiconductor package 20. One of the resulting input signals is applied to a first input 32 of the carrier amplifier 22, and the other input signal is applied to a second input 36 of the peaking amplifier 24. The carrier amplifier 22 produces a first output signal at a first output 40 and the peaking amplifier 24 produces a second output signal at a second output 44. In a Doherty configuration, the first input 32 and the first output 40 may constitute a gate terminal and a drain terminal of the carrier amplifier 22, respectively; and the second input 36 and the second output 44 may constitute a gate terminal and a drain terminal of the peaking amplifier 24, respectively. The first and second output signals are combined through a power combiner 46 to produce a combined high frequency output signal 48. The power combiner 46 may be coupled to a printed circuit board (not illustrated) or other substrate to which the semiconductor package 20 is coupled, or the power combiner 46 may be included within the semiconductor package 20. Those skilled in the art will recognize that a Doherty power amplifier semiconductor package typically includes additional electronic devices and circuitry not shown herein for simplicity of illustration. In addition, a Doherty power amplifier may include more than two signal paths, in other embodiments. For example, a Doherty power amplifier may include one carrier amplifier and multiple peaking amplifiers, in some embodiments.

In one embodiment, the carrier amplifier 22 is configured to be active for an entire range of output powers of Doherty power amplifier 10. Peaking amplifier 24 is configured to turn on only when the carrier amplifier 22 saturates. Power combiner 46, operating to combine the high frequency first output signal from the carrier amplifier 22 with the high frequency second output signal from peaking amplifier 24, may include a quarter-wave impedance inverter. The quarter-wave impedance inverter can add a ninety degree lag to the output signal from the carrier amplifier 22 or the peaking amplifier 24 in order to compensate for the phase delay added by the input splitter to the signal provided to either the peaking amplifier 24 or the carrier amplifier. The phase of the signal provided to peaking amplifier 24 is typically designed to lag that of the carrier amplifier 22 by ninety degrees so that the two output signals add in-phase when the output signals are combined at the output of power combiner 46 to form combined output signal 48. Alternatively, the phase of the signal provided to the carrier amplifier 22 may be designed to lag that of the carrier amplifier 22 (e.g., in an inverted Doherty amplifier configuration).

In the exemplary circuit in FIG. 1, each of the carrier amplifier 22 and peaking amplifier 24 may include a number of active and passive electrical elements. For example, the carrier amplifier 22 may include a first input impedance matching network (e.g., including one or more capacitors and inductors) that couples the first input 32 to a control terminal of a first transistor (e.g., an LDMOS or other type of transistor). The first transistor applies the appropriate amplification to the first input signal received at that input. An output of the first transistor can be connected to a first output impedance matching network (e.g., also including one or more capacitors and inductors), which in turn is connected to output 40. The first impedance matching networks operate to condition the input first signal that is amplified by the first transistor. Similarly, the peaking amplifier 24 can include a second input impedance matching network (e.g., including one or more capacitors and inductors) coupling the second input 36 to the control terminal of a second transistor (e.g., an LDMOS or other type of transistor). The second transistor applies the appropriate amplification to the second input signal received at the second input. An output of the second transistor can be connected to a second output impedance matching network (e.g., including one or more capacitors and inductors), which in turn is connected to output 44. The second impedance matching networks operate to condition the input second signal that is amplified by the second transistor. Those skilled in the art will recognize that the carrier amplifier 22 and peaking amplifier 24 may include additional electronic components not shown herein for simplicity of illustration.

With reference to the semiconductor package 20 in FIG. 2, the separate electrical components forming the carrier amplifier 22 and the peaking amplifier 24 are components, such as capacitors 54 and 55 and transistor 56 (having gate pad 57 and first current carrying terminal pad 58 (e.g., a drain or source pad)) fabricated on and/or subsequently mounted to a common (i.e., single) substrate 30, particularly a surface of a ground plane 60, for example. A second current carrying terminal (not shown) of transistor 56 is electrically coupled to ground plane 60. Substrate 30 and ground plane 60 may be distinct features of semiconductor package 20, or substrate 30 and ground plane 60 may be a single feature (e.g., an embodiment may include a solid, conductive flange to which the components forming the carrier amplifier 22 and the peaking amplifier 24 are directly mounted). Similarly, the peaking amplifier 24 includes a number of electrical devices, such as capacitors 62 and 63 and transistor 64 (having gate pad 66 and first current carrying terminal pad 67 (e.g., a drain or source pad)) fabricated on or subsequently mounted to the surface of the ground plane 60 located on a surface 31 of the substrate 30. A second current carrying terminal (not shown) of transistor 64 is electrically coupled to ground plane 60. Capacitors 54, 55, 62 and 63 may be, for example, metal-oxide-semiconductor (MOS) capacitors or other types of capacitors, each with one terminal electrically coupled to ground plane 60. The ground plane 60 is electrically connected to the first and second ground connectors 35 and 45, in an embodiment. The carrier amplifier 22 and the peaking amplifier 24 respectively form first and second circuits on the substrate 30 and combined form the electronic circuitry within the semiconductor package 20.

In a practical application, one or more of the signal paths (e.g., between inputs, outputs, capacitors, transistors and other components) of the carrier amplifier 22 are established using wire bonds 52. Likewise, wire bonds 53 may be used to establish one or more of the signal paths for the peaking amplifier 24.

A first ground connector 35 is located in between the first and second inputs 32 and 36 on one side of the semiconductor package 20 and a second ground connector 45 is located in between the first and second outputs 40 and 44 on the opposite side of the semiconductor package, in an embodiment. The first and second ground connectors 35 and 45 project outward from the exterior surfaces of the semiconductor package 20.

The symmetrical layout of the depicted semiconductor package 20 can result in the components of the carrier amplifier 22 being adjacent to corresponding components of the peaking amplifier 24. Accordingly, the arrangement of various components of each amplifier (including, specifically, the wire bonds 52 and 53 carrying high-frequency signals) are adjacent to and geometrically parallel with one another. These attributes of the wire bond arrays of the carrier and peaking amplifiers 22 and 24 can result in inductive coupling of the high frequency signals between the devices, which can reduce the performance of the overall circuitry.

To mitigate that inductive signal coupling, an electrically conductive isolation structure 50, shown in FIG. 1, is formed in between (e.g., in a plane between) the carrier amplifier 22 and the peaking amplifier 24 to provide electrical isolation between the wire bonds arrays and other components of those amplifiers. The isolation structure 50, as described in greater detail below, is fabricated as a structure in between circuit components in the semiconductor package that are to be electromagnetically isolated from each other. The material of the isolation structure 50 conducts, absorbs, or reflects electromagnetic emissions from either or both the carrier amplifier 22 or the peaking amplifier 24 preventing or substantially preventing those emissions from reaching the other amplifier. In various embodiments, the isolation structure 50 may be electrically connected directly to a ground plane (e.g., ground plane 60) or to a ground terminal (e.g., either or both of ground connectors 35, 45) which in turn is connected to ground potential during operation of the Doherty power amplifier 10. Alternatively, the isolation structure 50 may be electrically connected to a ground conductor of a printed circuit board (not illustrated) on which the semiconductor package 20 is mounted. In other implementations, a circuit applies a bias potential or signal to the isolation structure 50. In general, the isolation structure 50 operates as a shield to interrupt and inhibit the inductive coupling between the carrier amplifier 22 and the peaking amplifier 24 of the Doherty power amplifier 10. The isolation structure 50 may be built on or applied over the exterior surface of the semiconductor package 20 or may be built within the semiconductor package 20. Although the isolation structure 50 may take any one of several forms, such as those which are being described in detail herein, other isolation structure configurations may be used to implement the present inventive concept.

Figure 3:
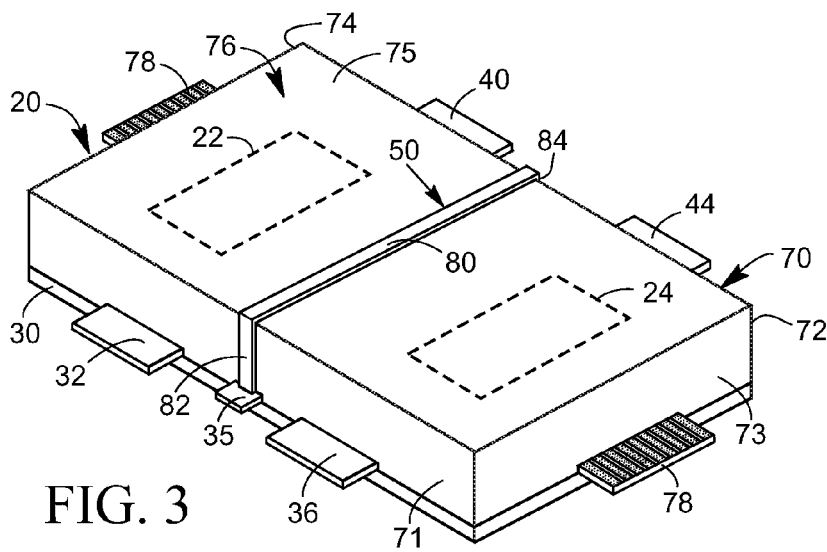
FIG. 3 is a perspective view illustrating one embodiment of the isolation structure according to the present concept.

With reference to an example in FIG. 3, the electronic circuitry of the portion of Doherty power amplifier 10 that is on the substrate 30 is enclosed under a separate cover 70 of the semiconductor package 20. In an embodiment, the cover 70 is a six sided body with a open bottom through which the electronic circuitry extends into the cover. Specifically the cover 70 has first, second, third and fourth side walls 71, 72, 73, and 74 arranged in a rectangle with adjacent walls being orthogonal to each other, for example. The bottom edge of each side wall 71-74 abuts the surface 31 of the substrate 30 and is adhered thereto by a conventional technique. The cover 70 further includes a primary wall 76, with an exterior major surface 75, which extends between the upper edges of the four side walls 71-74 across and above the circuitry mounted on the substrate 30. For example, the exterior major surface 75 is substantially parallel to the substrate surface 31 on which that circuitry is mounted.

The first and second inputs 32 and 36 and the first ground connector 35 extend outward from the substrate 30 beyond the first side wall 71 of the cover 70. Similarly, the first and second outputs 40 and 44 and the second ground connector 45 extend outward from the substrate 30 beyond the second side wall 72. Other connectors 78 may project outward beyond the third and fourth side walls 73 and 74 to provide bias power and control signals to the circuits within the semiconductor package 20.

In this example, the isolation structure 50 is formed on the exterior surfaces of the cover 70 at a position that is in between the carrier amplifier 22 and the peaking amplifier 24. In particular, the isolation structure 50 has an electrically conductive first leg 82 on the outside surface of the first side wall 71 and electrically connected directly to the first ground connector 35. That connection is made by staking the first leg 82 through an aperture in the first ground connector 35 as illustrated or by abutting the first leg and the first ground connector and using an electrically conductive material 85, such as solder or conductive epoxy. An electrically conductive cross member 80 extends over and across the exterior major surface 75 from a direct electrical connection to the first leg 82 to a point where the exterior major surface abuts the second side wall 72. At that point, the cross member 80 is electrically connected directly to an electrically conductive second leg 84 that extends downward along the outside surface of the second side wall 72 to a direct electrical connection with the second ground connector 45 (not visible). The first and second legs 82 and 84 are transverse (e.g., orthogonal) to the cross member 80 and to the plane of the substrate surface 31. Thus, the isolation structure 50 has an inverted U-shape conforming to the exterior surfaces of the cover 70 and being directly connected to the first and second ground connectors 35 and 45 on opposite sides of that cover.

Even though the embodiment of the isolation structure 50 in FIG. 3 has connections to the semiconductor package ground at opposite ends of the cross member 80, a connection at only one end or elsewhere along the length of the cross member 80 may be used.

Instead of connecting the isolation structure 50 to the ground connectors 35 and 45, the isolation structure can be electrically connected to the grounded flange (e.g., substrate 30 or ground plane 60. As another alternative, the isolation structure 50 can be electrically connected, such as by soldering for example, to one or more ground conductors of the printed circuit board (not shown) on which the package 20 is mounted when the package 20 is integrated into a larger system.

The cover 70 is made of a non-conductive material such a one having high electrical insulation properties. For example, a ceramic, an organic composite or a printed circuit board structure may be used. The isolation structure 50 may be applied to flat side walls and exterior major surface of the cover 70 or those parts of the cover may have recesses in which the isolation structure is located so as to be partially embedded within, flush with, or recessed below the exterior surfaces of the cover.

The cross member 80 and the first and second legs 82 and 84 are formed of a conductive material that is attached to, deposited on, adhered to, or otherwise overlaying the surfaces of the cover 70. For example, those elements of the isolation structure 50 may be screen printed onto the cover. Alternatively, the elements 80, 82 and 84 of the isolation structure 50 may be formed from a metal strip that is formed in or bent into a U-shape and adhered to the outer surfaces of the cover. The material of the isolation structure 50 conducts, absorbs, or reflects electromagnetic emissions from either or both of the carrier amplifier 22 and the peaking amplifier 24 during operations, thereby substantially inhibiting the high frequency signals in one amplifier from reaching the other amplifier. For example, the isolation structure 50 may be fabricated of copper, silver, gold, nickel, palladium, tungsten, molybdenum, a molybdenum-manganese alloy, an iron-nickel alloy, combinations of these materials, or other conductive materials. Although, the isolation structure 50 is being described for use with a Doherty power amplifier 10, these isolation structures can be used to mitigate inductive and electromagnetic coupling between other types of electronic circuits and devices.

The first and second legs 82 and 84 and the cross member 80 in the embodiment of FIG. 3 have equal widths, for example, between about 0.5 millimeters (mm) and 2.0 mm. Each of those elements of the isolation structure 50 have equal thickness up to 1.0 mm, for example. Nevertheless elements 80, 82 and 84 may have different relative and/or absolute widths and thicknesses. It should be noted that the thickness of those elements may be at least an order of magnitude less than the lengths of the first and second legs 82 and 84, in an embodiment. In other embodiments, the thickness of those elements may be larger, when compared with the lengths of the first and second legs 82 and 84.

According to an embodiment, the semiconductor package 20 is produced by fabricating the components of the circuitry (e.g., the carrier amplifier 22 and the peaking amplifier 24), coupling those components to the substrate 30, and separately fabricating the cover 70 with the isolation structure 50 thereon. Then, the previously fabricated cover 70 is affixed to the previously fabricated substrate 30 by a conventional technique, such as using a non-conductive epoxy, to thereby enclose the circuitry. Alternatively, the isolation structure 50 may be applied after the cover has been adhered to the substrate. In still another embodiment, the cover 70 may be formed from organic encapsulant material, and the cover 70 may be affixed to the substrate 30 by placing the substrate 30 in a form, flowing the encapsulant material over the substrate 30, and curing the encapsulant material to form the cover 70. The isolation structure 50 may be coupled to the substrate 30 before or after the encapsulant material is flowed over the substrate 30 and cured. Thereafter in either case, the isolation structure 50 then is electrically connected to the ground connectors 35 and 45.

Figure 4:
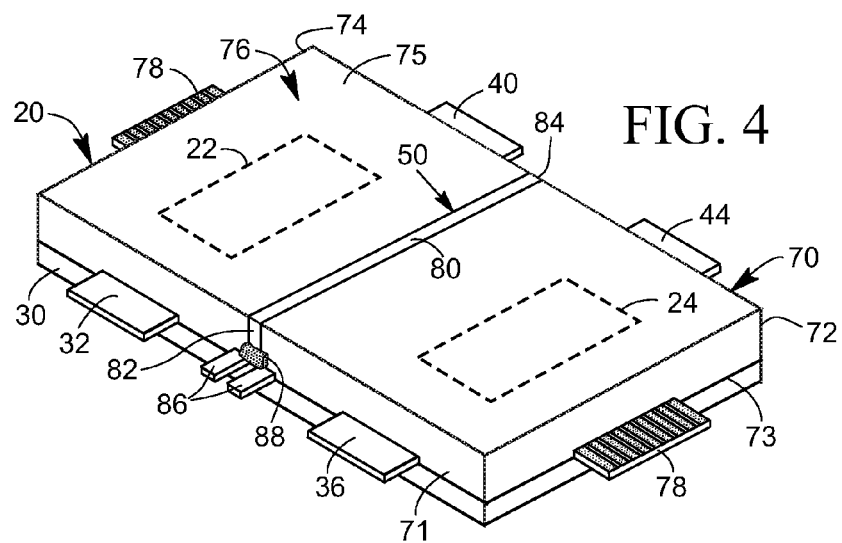
FIG. 4 is a perspective view showing another embodiment of the isolation structure.

FIG. 4 shows a variation of the isolation structure 50 in FIG. 3 in which a pair of first connectors 86 project outward from the first side wall 71. The pair of first connectors 86 is attached to a node, such as a ground node, of the electrical circuitry inside the semiconductor package 20. The cross member 80 and the first and second legs 82 and 84 are formed of electrically conductive material that is located in grooves in the respective surfaces of the cover 70. Thus the isolation structure 50 is flush with those cover surfaces. The first leg 82 of the isolation structure 50 is electrically connected directly to both of the first connectors 86 by electrically conductive material 88, such as solder or conductive epoxy. A pair of second connectors (not visible) projects outward from the second side wall 72 and are electrically connected directly to the second leg 84 of the isolation structure 50.

Figure 5:
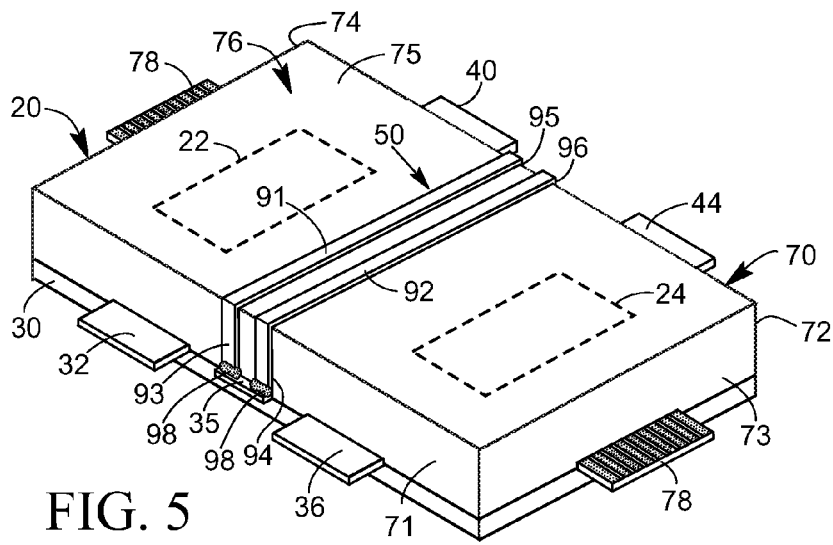
FIG. 5 is a perspective view illustrating a further embodiment of the isolation structure.

FIG. 5 shows another variation of the isolation structure 50 which has a pair of cross members 91 and 92 located in parallel on the exterior major surface 75 of the cover 70 and extending across that surface from the first side wall 71 to the second side wall 72. A pair of first legs 93 and 94 are located on the first side wall 71 and are electrically connected directly to the first and second cross members 91 and 92, respectively, and to the first ground connector 35. The first and second cross members 91 and 92 also may be electrically connected directly to a pair of second legs 95 and 96 located on the second side wall 72 of the cover 70. The second legs 95 and 96 are electrically connected directly to the second ground connector 45 (not visible). The first and second legs are electrically connected directly to the respective first or second ground connector 35 and 45 by electrically conductive material 98, such as solder or conductive epoxy. The cross members 91 and 92 and the legs 93, 94, 95 and 95 are formed of electrically conductive material that is deposited on, placed across, or adhered to the surfaces of the cover 70.

Figure 6:
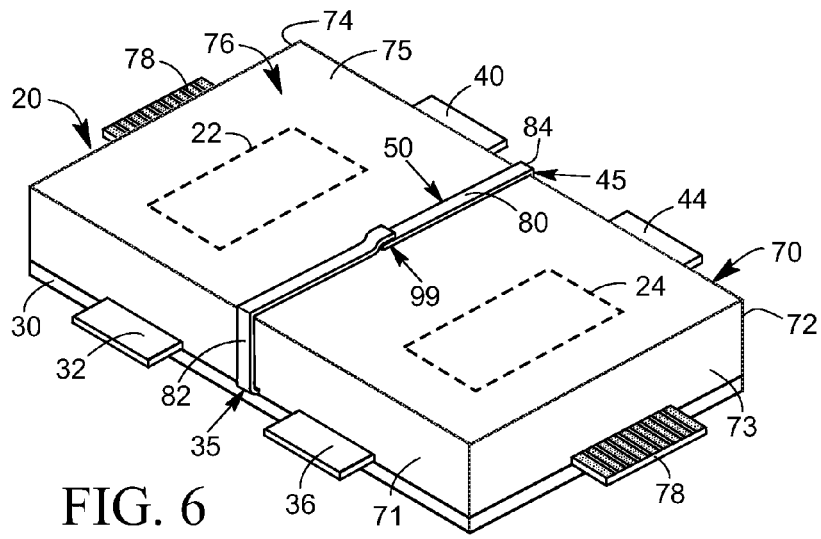
FIG. 6 is a perspective view showing still another embodiment of the isolation structure.

Referring to FIG. 6, another embodiment of the isolation structure 50 is formed by bending elongated first and ground connectors 35 and 45 upward against the respective first and second side walls 71 and 72 of the cover 70. The first and ground connectors 35 and 45 then are bent against the exterior major surface 75 of the cover so as to overlap each other at section 99, where the two ground connectors are electrically connected together.

Figure 7:
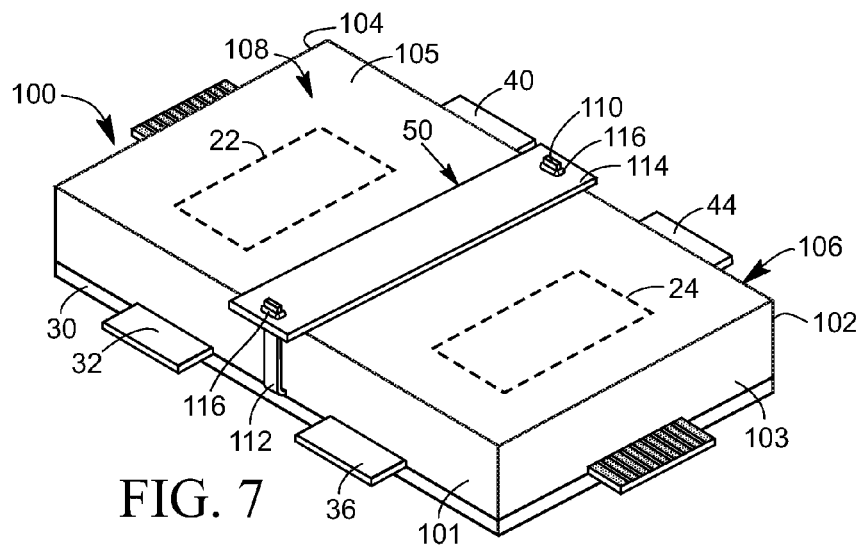
FIG. 7 is a perspective view showing yet another embodiment of the isolation structure.

With reference to FIG. 7, a further embodiment of the isolation structure 50 is configured for a semiconductor package 100 that has a cover 106 with four side walls 101, 102, 103 and 104 and a primary wall 108 with an exterior major surface 105. The substrate 30 has first and second ground terminals 110 and 112 projecting respectively from the first and second side walls 101 and 102 of the cover for a length that is slightly longer that the height of the cover. For example, after attachment of the cover 106 to the substrate 30, the first and second ground terminals 110 and 112 are bent against the respective first and second side walls 101 and 102, wherein the exposed ends of the ground terminals extend above the exterior major surface 105.

A cross member 114 extends across the exterior major surface 105 of the cover 106 projecting outward beyond the first and second side walls 101 and 102. The cross member 114 is a sheet of electrically conductive material, such as a metal, that may be bonded to the exterior major surface 105 or physically separate from the cover 106 and merely placed against the exterior major surface. The cross member 114 has a pair of apertures adjacent each end and through which the first and second ground terminals 110 and 112 project. The end sections of the first and second ground terminals 110 and 112 are electrically connected directly to the cross member 114, for example by electrically conductive material 116, such as solder or conductive epoxy. In an alternate embodiment, the end sections of the first and second ground terminals 110 and 112 may clip into the apertures of the cross member 114.

Figure 8:
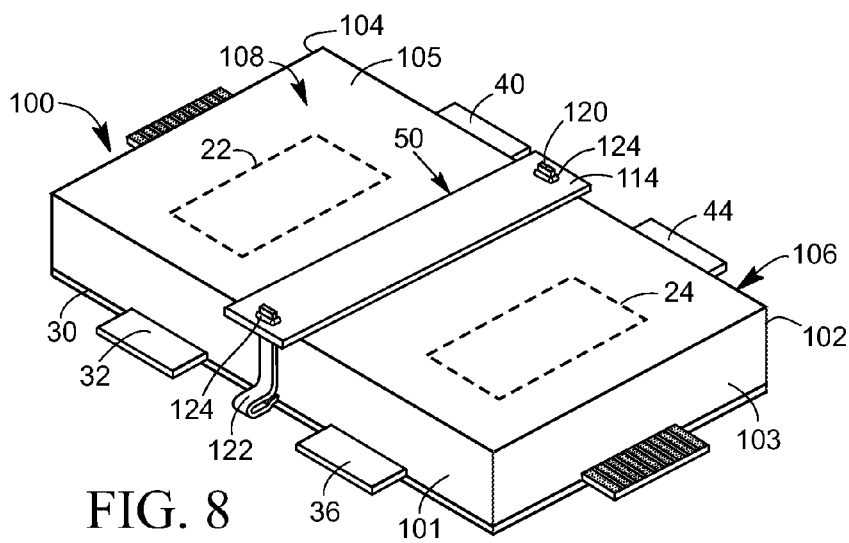
FIG. 8 is a perspective view illustrating a still further embodiment of the isolation structure.

FIG. 8 depicts a variation of the semiconductor package 100 in FIG. 7 in which the first and second ground terminals 120 and 122 are bent downward so as to contact a printed circuit board on which the semiconductor package will be mounted. That configuration enables the ground terminals to be electrically connected to contact pads of the circuitry on the printed circuit board. After bending downward, each of the first and second ground terminals 120 and 122 bends in a U back toward the adjacent first or second side wall 101 or 102 of the cover 106 and then upward toward the exterior major surface 105. The distal ends of the first and second ground terminals 120 and 122 project through the apertures in the cross member 114 that extends across the exterior major surface 105 and are electrically connected directly to the cross member by a conductive material 124 or by staking.

All the previously described embodiments of the isolation structure 50 are located on the exterior surfaces of the cover 70 that is attached to the substrate 30 to enclose the electronic circuitry. With reference to FIG. 9, an alternative embodiment of the isolation structure 130 is embedded within the cover 131 above the substrate 30 between the carrier amplifier 22 and the peaking amplifier 24. The isolation structure 130 has a cross member 132 underneath the exterior major surface 134 of the cover and substantially parallel to the surface 31 of the substrate 30. A first leg 135 of the isolation structure is within the first side wall 138 of the cover and a second leg 136 is within the second side wall 137. The cross member 132 is electrically connected directly to both the first and second legs 135 and 136.

For example, the isolation structure 130 is fabricated from a rigid or flexible body of electrically conductive material, such as a metal strip that is formed in or bent into an inverted U-shape. The cover 131 then is molded around the isolation structure 130 with the bottom ends of the first and second legs 135 and 136 being exposed. Alternatively, the isolation structure 130 could be formed on the interior surfaces of the cover 131. In addition the cover and the isolation structure can be produced by co-firing their respective dielectric and metal materials.

The fabricated cover 131 then is adhered to the substrate 30, using for example non-electrically conductive epoxy, except underneath the first and second legs 135 and 136 of the isolation structure where an electrically conductive epoxy 139 is used to electrically connect the first leg 135 and the first ground connector 35 and to electrically connect the second leg 136 and second ground connector 45. When the cover 131 is attached to the substrate 30, as shown in FIG. 9, an air cavity 133 is created inside the semiconductor package. In an alternate embodiment, encapsulant may completely cover the components within the package, an no air cavity 133 may be present.

With reference to FIG. 10, the present isolation structure can be used to reduce inductive coupling between the input(s) and the output(s) of an electronic circuit. For example, an isolation structure 140 mitigates coupling of high frequency signals between the first input 32 and the first output 40 of the carrier amplifier 22 and also between the second input 36 and the second output 44 of the peaking amplifier 24 underneath the cover 142. To accomplish such input/output isolation, the isolation structure 140 is oriented orthogonally on the cover 142 to the direction previously described for isolation between those amplifiers 22 and 24. Specifically, the cover 142 has a first side wall 151 and a second side wall 152 through which the first and second inputs 32 and 36 and the first and second outputs 40 and 44 respectively project. The first and second side walls 151 and 152 are linked by opposing third and fourth side walls 153 and 154. The four side walls 151-154 of the cover 142 abut a primary wall 156 that has an exterior major surface 155. For input/output isolation, the isolation structure 140 has a cross member 144 attached to or overlying, or fully or partially embedded within or below the cover's exterior major surface 155 and extending from the side wall 153 to the fourth side wall 154. Therefore, the cross member 144 extends across the exterior major surface 155 between the two inputs 32 and 36 and the two outputs 40 and 44. A first leg 146 of the isolation structure 140 is located on the third side wall 153 and is in direct electrical connection with both the cross member 144 and a first ground connector 157 that projects through the third side wall 153. A second leg 148 is located on the opposite fourth side wall 154 and is electrically connected directly to both the cross member 144 and a second ground connector (not visible) that projects through the fourth side wall in the same manner as the first ground connector 157 projects through the third side wall. The first and second legs 146 and 148 are electrically connected to the respective ground connector, for example by electrically conductive material 158 such as solder or conductive epoxy.

It should be understood that isolation structure 140 providing electromagnetic isolation between an input and an output can have other configurations, such as those shown in FIGS. 4-9 for example. Furthermore, the input/output isolation structure 140 can be used on a semiconductor package that has a plurality of inputs and a plurality of outputs as in FIG. 10 or only one input and one output.

In the various embodiments described herein, instead of being directly connected to the ground connectors 35 and 45, one or both of the first and second legs of the isolation structure can electrically connect the cross member to the ground plane 60 (FIG. 1) or another ground node of the circuitry inside the semiconductor package 20. As a further alternative, the isolation structure's cross member, that extends across and over the electronic circuits, can be electrically connected to the grounded flange (e.g., a unitary feature that corresponds to both the ground plane 60 and substrate 30). As another alternative, the first and/or second legs of the isolation structure could be electrically connected, such as by soldering for example, to one or more ground conductor of the printed circuit board on which the semiconductor package is mounted.

Figure 2:
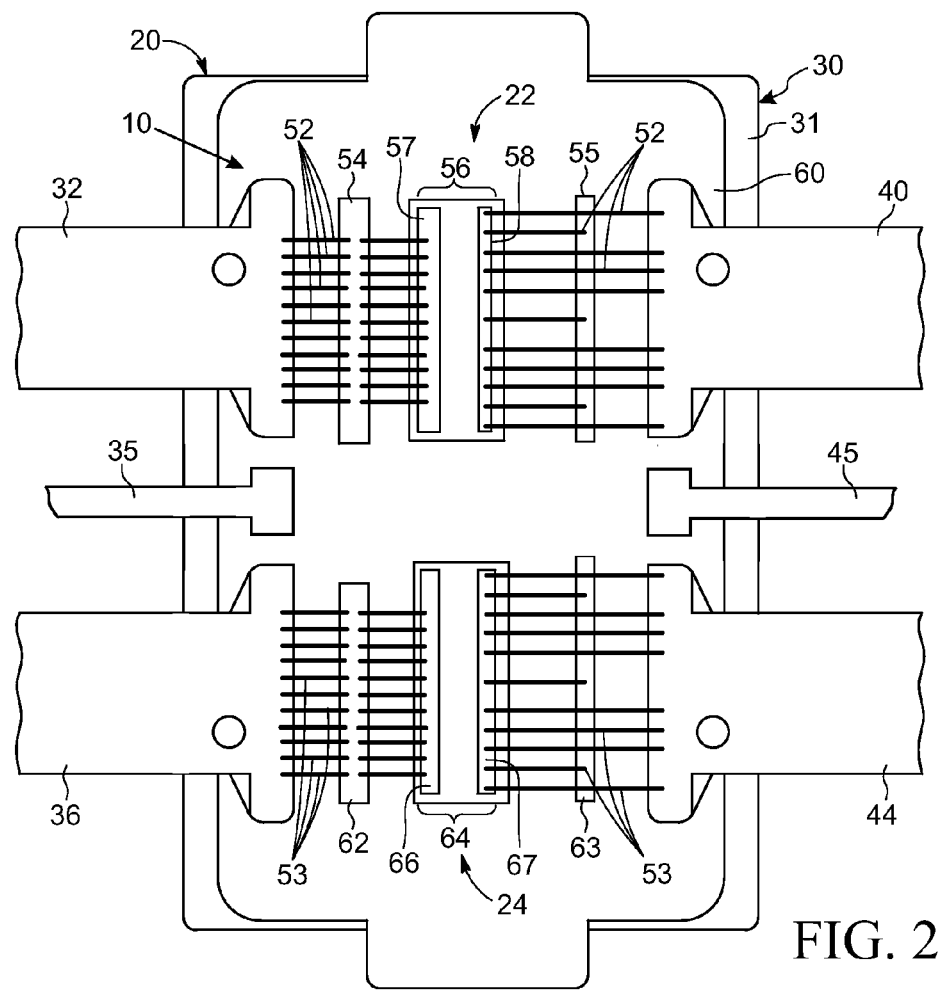
FIG. 2 is a top schematic view of components of the carrier and peaking amplifiers for the exemplary Doherty power amplifier in the semiconductor package.
Figure 11:
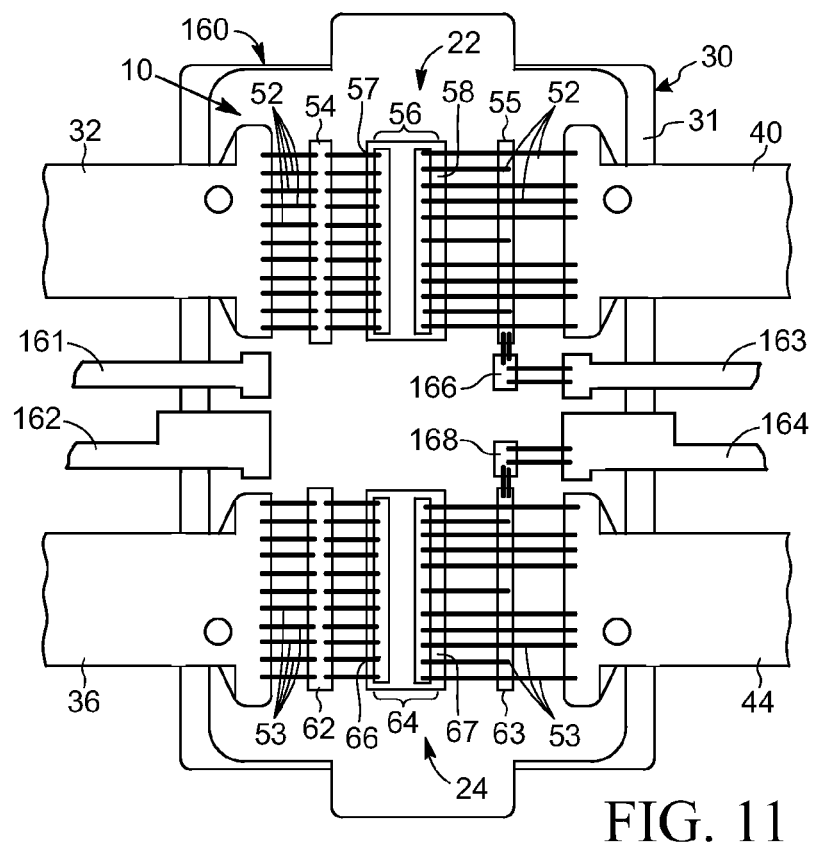
FIG. 11 is a top schematic view of components of the carrier and peaking amplifiers for another exemplary Doherty power amplifier in a semiconductor package.

FIG. 11 illustrates a semiconductor package 160 with portions of a Doherty power amplifier 10 similar to that in FIG. 2 wherein identical components have been assigned the same reference numeral. The Doherty power amplifier 10 comprises a carrier amplifier 22 and a peaking amplifier 24 located on a common substrate 30.

The semiconductor package 160 has first and second ground connectors 161 and 162 projecting outward between the first and second inputs 32 and 36, and has third and fourth ground connectors 163 and 164 projecting outward between the first and second outputs 40 and 44. The third ground connector 163 is coupled to the output capacitors 55 of the peaking amplifier 24 by a first bias capacitor 166 and the fourth ground connector 164 is coupled to the output capacitor 63 of the carrier amplifier 22 by a second bias capacitor 168. The coupling provided by the first and second bias capacitors 166 and 168 isolates the third and fourth ground connectors 163 and 164, respectively, from the DC ground of the Doherty power amplifier 10, while presenting a low impedance at the radio frequencies of the amplifier signals thereby applying the RF ground potential to those ground connectors. Alternatively, the first and second bias capacitors 166 and 168 may be on the exterior of the semiconductor package 160.

Figure 12:
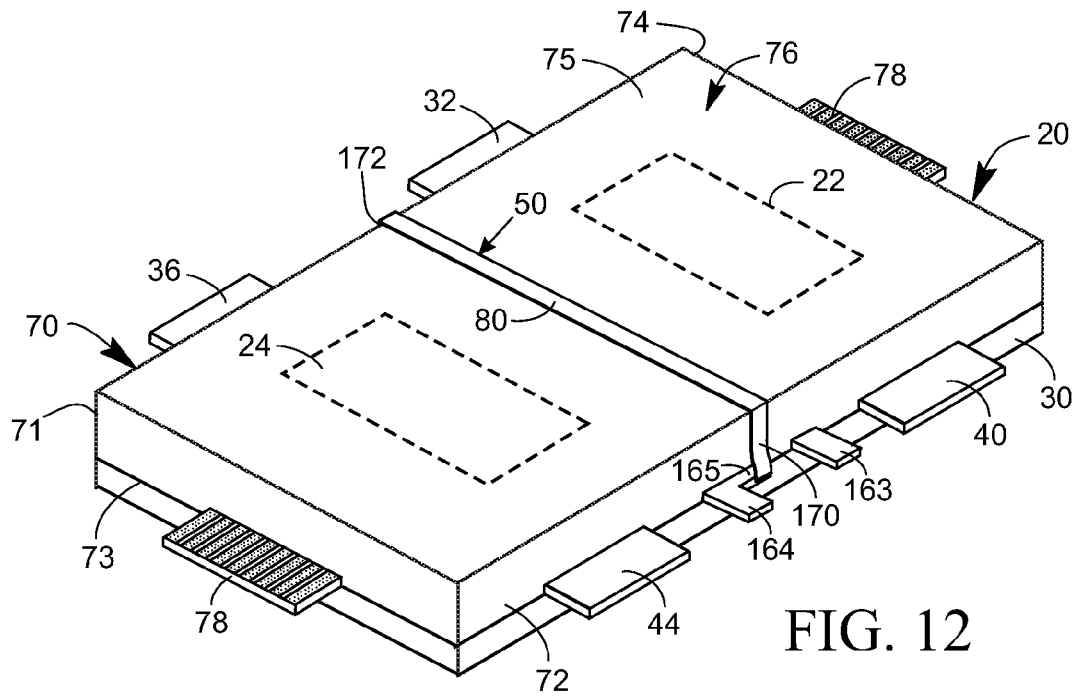
FIG. 12 is a perspective view of the semiconductor package showing connection of the isolation structure to electrical leads of the Doherty power amplifier in FIG. 10.

With reference to FIG. 12, an isolation structure 50, such as the one shown in FIG. 3 and described previously, is applied to the cover 70 of the semiconductor package 160. However, the lower section of the electrically conductive first leg 170 of the isolation structure 50 is not attached to the outside surface of the second side wall 72. This enables the lower section to be bent away from that surface and over the outer edge of a transverse portion 165 of the fourth ground connector 164. The lower section of the first leg 170 is electrically connected, such as by solder or electrically conductive epoxy, directly to the fourth ground connector 164. This connection and the second bias capacitor 168 couple the isolation structure 50 to the RF ground of the Doherty power amplifier 10, while isolating the isolation structure from the DC ground. The electrically conductive second leg 172, that extends downward along the outer surface of the cover's first side wall 71, is similarly bend outward and electrically connected to a transverse portion of the second ground connector 162 (not visible).

Alternatively, the shapes of the first and second ground connectors 161 and 162 may be reversed and the shapes of the third and fourth ground connectors 163 and 164 also may be reversed. In this variation, the electrically conductive first leg 170 of the isolation structure 50 is electrically connected to the transverse portion of the third ground connector 163, and the electrically conductive second leg 172 is electrically connected to the transverse portion of the first ground connector 161. In another alternative, the lower sections of the first leg 170 of the isolation structure 50 can be split apart partially lengthwise and electrically connected to both the third and fourth ground connectors 163 and 164. The lower sections of the second leg 172 also can be split apart partially lengthwise and electrically connected to both of the first and second ground connectors 161 and 162.

Although embodiments of the isolation structure have been described herein with respect to a Doherty power amplifier with one carrier amplifier and one peaking amplifier, those of skill in the art would understand, based on the description herein, that embodiments of the inventive subject matter may be used in conjunction with virtually any type of multiple path amplifier. Accordingly, the various embodiments are not limited to use with Doherty amplifiers, nor are they limited to use with amplifiers or other electronic devices having only two independent circuits or signal paths. For example, an alternate embodiment may include a device with three or more circuits or signal paths, and isolation structures may be provided between each pair of adjacent circuits or signal paths. In addition, although various embodiments have been described with respect to air cavity types of semiconductor device packages, the inventive concepts also could be applied to overmolded (encapsulated) semiconductor device packages and other types of package housings.

In one exemplary embodiment, a cover extends over the circuits and includes a major surface and two side walls both abutting the major surface. Now, the isolation structure includes a first leg proximate to (e.g., overlying, underlying or inside) the first side wall and a first cross member proximate to (e.g., overlying, underlying, or inside) the major surface and electrically connected to the first leg. The isolation structure is configured to reduce electromagnetic coupling between the first circuit and the second circuit during an operation of at least one of the first circuit and the second circuit.

In another embodiment, a semiconductor device includes a substrate having a surface, electronic circuitry on the substrate and including a plurality of electrical components, where the circuitry has an input and an output, and an isolation structure having a first cross member spaced from and extending over the surface of the substrate between the input and the output. The isolation structure is configured to reduce electromagnetic coupling between the input and the output during an operation of the circuitry.

The foregoing description was primarily directed to preferred embodiments of the invention. Although some attention was given to various alternatives within the scope of the invention, it is anticipated that one skilled in the art will likely realize additional alternatives that are now apparent from disclosure of embodiments of the invention. Accordingly, the scope of the invention should be determined from the following claims and not limited by the above disclosure.

What is claimed is:

1. A semiconductor device comprising:
   a substrate having a surface;
   an electronic device formed on the substrate and comprising a first electrical component and a second electrical component;
   a cover fabricated separate from and adhered to the substrate so as to extend over the first electrical component and the second electrical component, the cover including first and second side walls between which a primary wall extends; and
   an isolation structure including:
      a first cross member contiguous with the cover and extending over the surface of the substrate in between the first electrical component and the second electrical component, the first cross member being formed on the primary wall, and
      a first leg located on the first side wall, wherein the first leg is electrically connected to the first cross member,
   wherein the isolation structure is configured to reduce electromagnetic coupling between the first electrical component and the second electrical component during an operation of the electronic device.

2. The semiconductor device as recited in claim 1, wherein the isolation structure is formed of electrically conductive material.

3. The semiconductor device as recited in claim 2, wherein the electronic device has a ground potential node, and the isolation structure is electrically connected to the ground potential node.

4. The semiconductor device as recited in claim 3, further comprising a capacitor coupling the isolation structure to the ground potential node.

5. The semiconductor device as recited in claim 2, further comprising a first electrical connector projecting outward from the substrate and electrically connected directly to the isolation structure.

6. The semiconductor device as recited in claim 1, wherein the isolation structure further comprises a second leg contiguous with the second side wall and electrically connected to both the first cross member and to a second electrical connector projecting outward from the substrate.

7. The semiconductor device as recited in claim 1, wherein the isolation structure further comprises a second cross member mounted to the cover and electrically connected to the first electrical connector.

8. The semiconductor device as recited in claim 1, wherein the isolation structure further comprises a second cross member mounted to the cover and electrically connected in common with the first cross member.

9. The semiconductor device as recited in claim 1, further comprising first and second electrical connectors projecting from the substrate and parallel to two side walls of the cover, wherein the first cross member is electrically connected to the first and second electrical connectors.

10. The semiconductor device as recited in claim 9, wherein the first cross member has a pair of apertures into which the first and second electrical connectors extend.

11. The semiconductor device as recited in claim 9, wherein each of the first and second electrical connectors has a section configured to electrically connect to a printed circuit board on which the semiconductor device is mounted.

12. The semiconductor device as recited in claim 1, wherein the isolation structure is mounted on one of an exterior surface and an interior surface of the cover.

13. The semiconductor device as recited in claim 1, wherein the isolation structure is embedded inside the cover.

14. A method of fabricating a semiconductor device with isolation between components of the semiconductor device, the method comprising:
   forming a first component on a substrate;
   forming a second component on the substrate;
   adhering a cover to the substrate, the cover including first and second side walls between which a primary wall extends; and
   coupling an isolation structure of electrically conductive material to the cover by:
      forming a cross member on the primary wall and in between the first and second component, and
      locating a first leg on the first side wall, wherein the first leg is electrically connected to the cross member,
   the isolation structure having at least a portion that is spaced from and extends over the substrate in between the first component and the second component, wherein the isolation structure being configured to reduce electromagnetic coupling between the first component and the second component during an operation of the semiconductor device.

15. The method as recited in claim 14 further comprising electrically connecting the first leg to an electrical node located on the substrate.

16. The method as recited in claim 14, further comprising capacitively coupling the first leg to an electrical node located on the substrate.

17. The method as recited in claim 14 wherein coupling an isolation structure further comprises locating a second leg on the second side wall, wherein the second leg is electrically connected to the cross member.

18. The method as recited in claim 17 further comprising electrically connecting the first leg to an electrical node located on the substrate.

* * * * *

UNITED STATES PATENT AND TRADEMARK OFFICE
CERTIFICATE OF CORRECTION

PATENT NO. : 9,349,693 B2  
APPLICATION NO. : 14/451962  
DATED : May 24, 2016  
INVENTOR(S) : Lakshminarayan Viswanathan et al.

Page 1 of 1

It is certified that error appears in the above-identified patent and that said Letters Patent is hereby corrected as shown below:

TITLE PAGE

Item 71 the applicant's name Viswanathan Lakshminarayan should be:
-- Lakshminarayan Viswanathan --

Item 72 the inventor's name Viswanathan Lakshminarayan should be:
-- Lakshminarayan Viswanathan --

Signed and Sealed this
Twelfth Day of July, 2016

Michelle K. Lee
*Director of the United States Patent and Trademark Office*